United States Patent [19]
Rao

[11] Patent Number: 6,041,389
[45] Date of Patent: *Mar. 21, 2000

[54] MEMORY ARCHITECTURE USING CONTENT ADDRESSABLE MEMORY, AND SYSTEMS AND METHODS USING THE SAME

[75] Inventor: G. R. Mohan Rao, Dallas, Tex.

[73] Assignee: E Cirrus Logic, Inc.

[*] Notice: This patent issued on a continued prosecution application filed under 37 CFR 1.53(d), and is subject to the twenty year patent term provisions of 35 U.S.C. 154(a)(2).

[21] Appl. No.: 08/559,379

[22] Filed: Nov. 16, 1995

[51] Int. Cl.[7] ................................................ G06F 12/00
[52] U.S. Cl. .............................. 711/108; 711/106; 711/3; 365/189.04; 365/200
[58] Field of Search ........................ 365/185.24, 189.04, 365/49, 200; 395/445; 711/108, 106, 3

[56] References Cited

U.S. PATENT DOCUMENTS

| 5,226,009 | 7/1993 | Arimoto | 365/189.04 |
| 5,249,282 | 9/1993 | Segers | 395/445 |
| 5,258,946 | 11/1993 | Graf | 365/49 |
| 5,327,383 | 7/1994 | Merchant et al. | 365/185.24 |

OTHER PUBLICATIONS

"Content Addressable Memory" Jul. 17, 1995 EDN Products edition pp. 1 & 2.

*Primary Examiner*—John W. Cabeca
*Assistant Examiner*—Fred F. Tzeng
*Attorney, Agent, or Firm*—James J. Murphy, Esq.; Steven A. Shaw, Esq.

[57] ABSTRACT

A memory 200 including an array 202 of addressable memory cells and a content addressable memory cell 207/300 for comparing a received select bit with a stored select bit and enabling access to addressed ones of the memory cells in response.

23 Claims, 4 Drawing Sheets

MEMORY ARCHITECTURE USING CONTENT ADDRESSABLE MEMORY, AND SYSTEMS AND METHODS USING THE SAME

TECHNICAL FIELD OF THE INVENTION

The present invention relates in general to memory architectures and in particular to a memory architecture using content addressable memory and systems and methods using the same.

BACKGROUND OF THE INVENTION

A typical processing system with video/graphics display capability includes a central processing unit (CPU), a display controller coupled to the CPU by a CPU local bus (directly and/or through core logic), a system memory coupled to the CPU local bus through core logic, a frame buffer memory coupled to the display controller via a peripheral local bus (e.g., PCI bus), peripheral circuitry (e.g., clock drivers and signal converters, display driver circuitry), and a display unit.

The CPU is the system master and generally provides overall system control in conjunction with the software operating system. Among other things, the CPU communicates with the system memory, holding instructions and data necessary for program execution, normally through core logic. Typically, the core logic is two to seven chips, with one or more chips being "address and system controller intensive" and one or more other chips being "data path intensive." The CPU also, in response to user commands and program instructions, controls the contents of the graphics images to be displayed on the display unit by the display controller.

The display controller, which may be, for example, a video graphics architecture (VGA) controller, generally interfaces with the CPU and the display driver circuitry, manages the exchange of graphics and/or video data between the frame buffer and the CPU and the display during display data update and screen refresh operations, controls frame buffer memory operations, and performs additional basic processing on the subject graphics or video data. For example, the display controller may also include the capability of performing basic operations such as line draws and polygon fills. The display controller is for the most part a slave to the CPU.

Generally, improvements in access time to any of the system memory resources will increase system performance. For example, reduction in the amount of time required by the CPU/core logic to access given data from system memory will allow more data to be accessed during a given time period. Alternatively, faster memory access provides additional time during which the CPU and/or core logic can perform other critical tasks. One particular instance where improved access times can substantially improve system performance is during retrieval of data from system memory for storage in cache.

Most PC systems include one or two levels of data cache for improving access time to data by the CPU. The "L1" cache is normally integral to the CPU chip and consists of 8 to 16 kilobytes of fast static RAM (SRAM). The "L2" cache (when provided) is normally off-chip (coupled to the CPU and the core logic by the CPU local bus) and typically consists of 256 k to 512 kilobytes of fast SRAM. The SRAMs of the cache memory have substantially faster cycle times than the DRAMs of the system memory (e.g. 7 to 10 nsecs for a random access to an SRAM cache versus 110 to 130 nsecs for a random access, or 40 nsecs for a page access, to the system memory DRAM). Therefore, blocks of data are read from the system memory and written into the cache in anticipation of the data needs of the CPU. This "encachement" is typically done by the operating system as a function such factors as the spacial and/or temporal locality of the data required by the CPU during a sequence of operations. If the CPU requires data for a given operation, and that data is already part of the encached block (i.e a "cache hit" occurs), it can be accessed much faster than from the system memory. By selecting latency and density ratios between the system memory and the cache memory to be on the order of 10 to 1, and depending on the partitioning of the system memory by the operating system, cache hits for reads to the cache can exceed 95%.

Thus, the need has arisen for improved methods and hardware for accessing memory. Such methods and hardware would be particularly useful in implementing unified system memory-frame buffer systems and for effectuating system memory-frame buffer data transfers in more conventional systems.

Additionally, as system memory granularity, band width and density demands and system clock speeds increase, the need to improve the efficiency of cache memories and cache memory operations has arisen. In particular, the need has arisen for circuits and methods for transferring data from the system memory to the cache during encachement operations.

SUMMARY OF THE INVENTION

According to one embodiment of the principles of the present invention, a memory is provided which includes an array of addressable memory cells. A content addressable memory cell is also included for comparing a received select bit with a stored select bit and enabling access to addressed ones of the memory cells in response.

According to a second embodiment of the present invention, a memory subsystem is provided which includes first and second arrays of memory cells, first addressing circuitry for selectively accessing ones of the cells of the first array, and second addressing circuitry for selectively accessing ones of the cells in the second array. At least one first content addressable memory cell is provided for storing a first bank select bit associated with the first array of memory cells, the first content addressable memory cell comparing the stored first bank select bit with a received bank select bit and enabling the first addressing circuitry upon a match. At least one second content addressable memory cell is provided for storing a second bank select bit associated with the second array of memory cells, the second content addressable memory cell comparing the stored second bank select bit with a received bank select bit and enabling the second addressing circuitry upon a match.

The principles of the present invention are also embodied in memory devices including an address bus, a bank select bus, and plurality of memory banks. Each memory bank includes an array of rows and columns of memory cells, row and column decoders for accessing selected cells within the array, circuitry for coupling addresses presented on the address bus to the decoders in response to an enable signal and array of content addressable memory cells for comparing stored bank select bits with bank select bits presented on the bank select bus and generating the enable signal when a match occurs.

The principles of the present invention are further embodied in methods for accessing a memory system including a bank of memory cells and associated addressing circuitry, the bank associated with at least one content addressable memory cell. A bit is stored in the content addressable memory cell identifying the bank. A bank select bit is presented to the content addressable memory cell and compared in the content addressable memory cell with the stored bit. Access to selected cells in the array is then enabled with the stored bit and the presented bit match.

Circuit systems and methods embodying the principles of the present invention provide substantial improvement over prior art addressing schemes. In particular, the principles of the present invention allow the arrays of memory cells in multiple bank/multiple memory device systems to be individually addressed on an application by application basis. Specifically, the use of CAM array cells in which a bank select bit can be written upon system initialization allows the system processing circuitry to optimize memory usage based on operating system requirements. In particular, the principles of the present invention allow for the efficient transfer of data from system memory to cache during encachement operations or from the system memory to the frame buffer during display update operations.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–4 of the drawings, in which like numbers designate like parts. While memory devices embodying the principles of the present invention are useful in a wide number of applications, for purposes of illustration, such memory devices will be described in conjunction with a basic processing system architecture typically employed in personal computers.

Figure 1A:
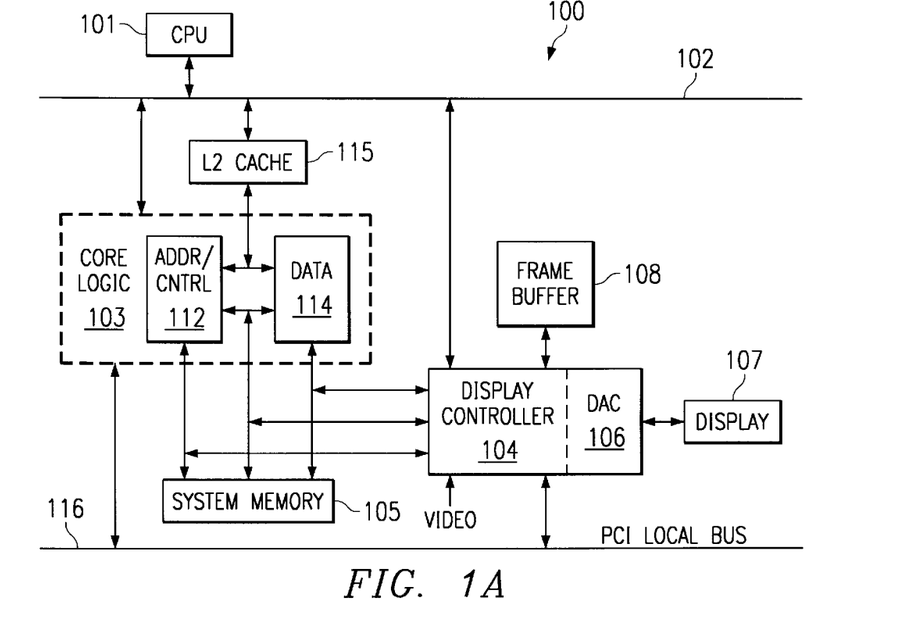
FIGS. 1A and 1B are high level functional block diagrams of exemplary information processing systems in which one or more memories embodying the principles of the present invention may be employed.

FIG. 1A is a high level functional block diagram of the portion of a processing system 100. System 100 includes a central processing unit 101, a CPU local bus 102, core logic 103, a display controller 104, a system memory 105, a digital to analog converter (DAC) 106, frame buffer 108 and a display device 107.

CPU 101 is the "master" which controls the overall operation of system 100. Among other things, CPU 101 performs various data processing functions and determines the content of the graphics data to be displayed on display unit 107 in response to user commands and/or the execution of application software. CPU 101 may be for example a general purpose microprocessor, such as an Intel Pentium class microprocessor or the like, used in commercial personal computers. CPU 101 communicates with the remainder of system 100 via CPU local bus 102, which may be for example a special bus, or a general bus (common in the industry).

Core logic 103, under the direction of CPU 101, controls the exchange of data, addresses, control signals and instructions between CPU 101, display controller 104, and system memory 105. Core logic 103 may be any one of a number of commercially available core logic chip sets designed for compatibility with the remainder of the system, and in particular with CPU 101. One or more core logic chips, such as chip 112 in the illustrated system, are typically "address and system controller intensive" while one or more core logic chips, such as chip 114 in FIG. 1, are "data intensive." Address intensive core logic chip 112 generally: interfaces CPU 101 with the address path of CPU bus 102; maintains cache memory, including the cache tags, set associative cache tags and other data necessary to insure cache coherency; performs cache "bus snooping"; generates the control signals required for DRAMs in the system memory or cache; and controls general management transactions. Data intensive chip 114 generally: interfaces CPU 101 with the data path of CPU bus 102; issues cycle completion responses to address chip 112 or CPU 101; may abort operations if their cycles are incomplete; and arbitrates for the data path of bus 102.

CPU 101 can directly communicate with core logic 103 or through an external (L2) cache 115. L2 cache 115 may be for example a 256 KByte fast SRAM device(s). It should be noted that CPU 101 can also include on-board (L1) cache, typically up to 16 kilobytes.

Display controller 104 may be any one of a number of commercially available VGA display controllers. For example, display controller 104 may be one of the Cirrus Logic CL-GD754x series of display controllers. The structure and operation of such controllers is described in CL-GD754x Application Book, Rev 1.0, Nov. 22, 1994, and CL-GD7542 LCD VGA Controller Preliminary Data Book, Rev. 1.0.2, June 1994, both available from Cirrus Logic, Inc., Fremont, Calif., and incorporated herein by reference. Display controller 104 may receive data, instructions and/or addresses from CPU 101 either through core logic 103 or directly from CPU 101 through CPU local bus 102. Data, instructions, and addresses are exchanged between display controller 104 and system memory 105 through core logic 103. Further, addresses and instructions may be exchanged between core logic 103 and display controller 104 via a local bus which may be for example a PCI local bus. Generally, display controller 104 controls screen refresh, executes a limited number of graphics functions such as line draws, polygon fills, color space conversion, display data interpolation and zooming, and video streaming and handles other ministerial chores such as power management. Most importantly, display controller 104 controls the raster of pixel data from frame buffer 108 to display unit 107 during screen refresh and interfaces CPU 101 and frame buffer 108 during display data update. Video data may be directly input into display controller 104.

Digital to analog converter 106 receives digital data from controller 104 and outputs the analog data to drive display 107 in response. In the illustrated embodiment, DAC 106 is integrated with display controller 104 onto a single chip. Depending on the specific implementation of system 100, DAC 106 may also include a color palette, YUV to RGB format conversion circuitry, and/or X- and Y-zooming circuitry, to name a few options. Display 107 may be for example a CRT unit, a liquid crystal display, electroluminescent display, plasma display, or other type of display device which displays images on a screen as a plurality of pixels. It should also be noted that in alternate embodiments, "display" 107 may be another type of output device such as a laser printer or similar document view/print appliance.

The data paths in system 100 will vary with each design. For example, system 100 may be a "64-bit" or "72-bit" system. Assume for discussion purposes that a 64-bit system is chosen. Then, each of the data connections, including the data paths of CPU bus 102 and PCI bus 116, the data paths through core logic 103 to system memory 105 and display controller 104, and the data interconnection between display controller 104 and frame buffer 108, are all 64 bits wide. It should be noted that the address interconnections will vary depending on the size of the memory and such factors as the need to support data byte select, error detection correction, and virtual memory operations. In a typical CPU processor system today, the address portions of CPU bus 102 and PCI bus 116 are typically on the order of 30 bits wide.

Figure 1B:
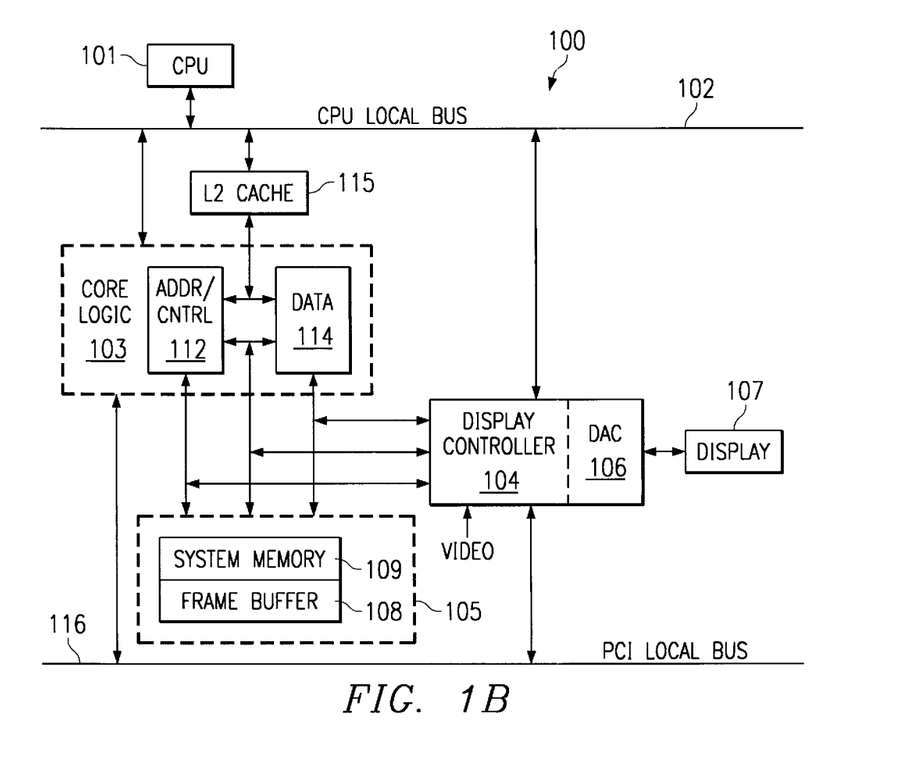

FIG. 1B is an alternate system architecture to which the principles of the present invention may advantageously applied. In this example, memory 105 is a "unified" memory system since the system memory 109 and frame buffer 108 are collocated in a single integrated circuit or bank of integrated circuits. This is in contrast to those systems in which the frame buffer is separate and apart from the system memory and interfaces with the remainder of the system through the display controller. System memory 109 again is preferably a traditional system memory which stores data, addresses, and instructions under the command of CPU 101 as required for executing various processing functions and applications programs. As in traditional systems, the frame buffer 108 stores the pixel data required to generate the required images on the screen of display unit 107.

Figure 2:
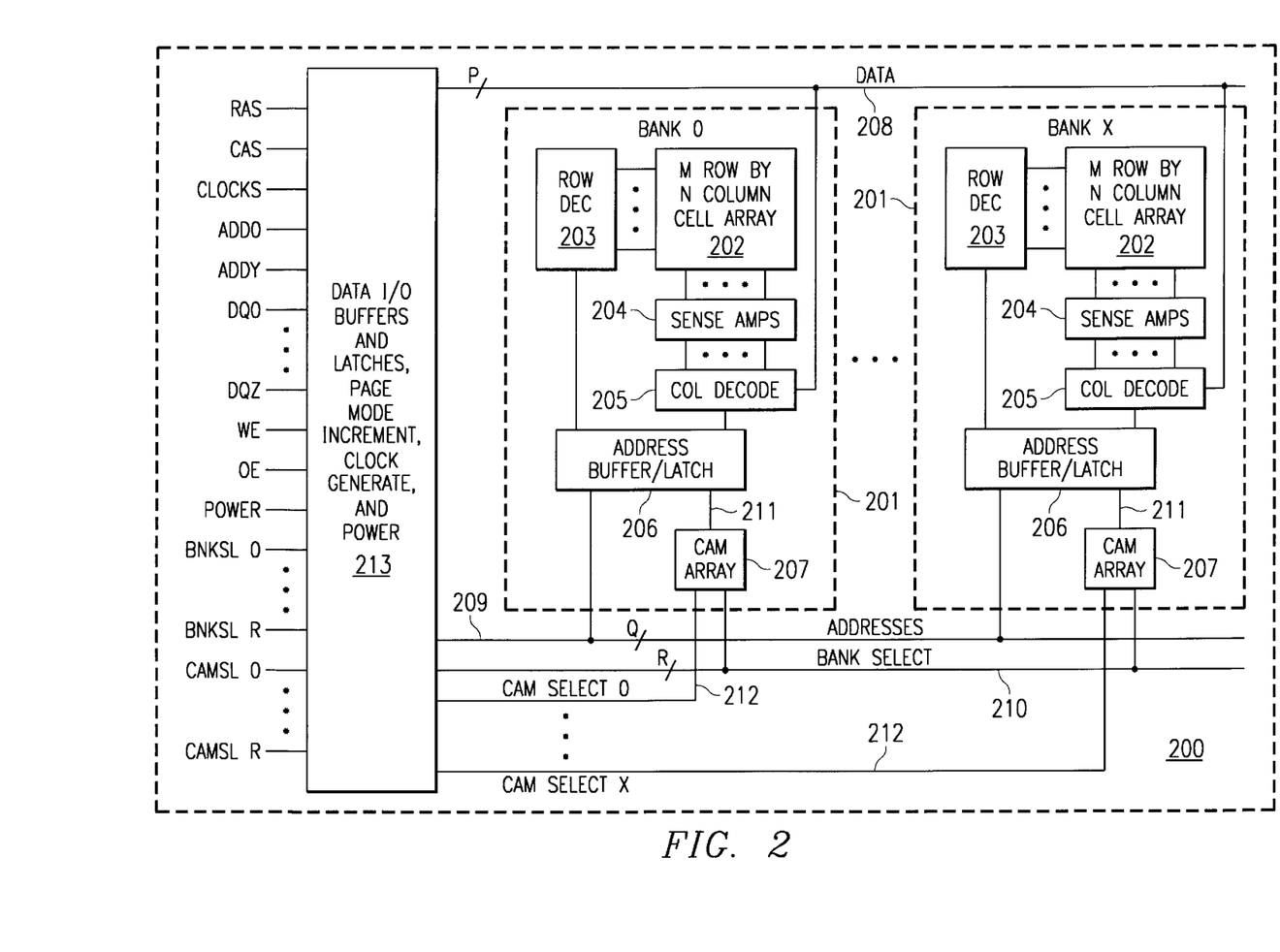
FIG. 2 is a functional block diagram of a single chip, multi-bank memory device embodying the principles of the present invention.

FIG. 2 is a functional block diagram of a multibank single chip memory device 200 embodying the principles of the present invention. In the embodiment illustrated in FIG. 2, include X number of banks 201, where X is a positive integer greater than or equal to 2. For discussion purposes, it will be assumed that memory 200 contains 16 banks by 1 (i.e. X equals 16).

Each bank 201 includes an array 202 of memory cells arranged as M rows and N columns. For example, if each array 202 contained four megabytes (32 megabits), then one possible arrangement would be 4 K rows by 8 K columns. In the preferred embodiment, each array 202 is constructed from dynamic random access memory (DRAM) cells, although an alternate embodiment of other types of data storage devices, such as static random access memory (SRAM) cells or ferroelectric random access memory (FRAM) cells may be used. Each bank 201 further includes conventional row decoder circuitry 203, sense amplifier circuitry 204, and column decode circuitry 205. Row decoder circuitry 203 is coupled to the wordline associated with each of the M rows in cell array 202 and selects one row in response to a row address word received and stored in address buffer/latch 206.

Sense amplifiers 204 are coupled to the bitlines associated with each of the N columns of each array 202. Sense amplifiers 204 sense the data along a selected row using conventional differential sensing techniques. Column decoder 205 selects for access (i.e. read or write) P number of cells along the selected row in response to column address bits received and latched in address buffer/latch 206. For example, if given bank 201 is organized as a ("by 32") device, then P equals 32 and a 32 bit location along the selected row is accessed per column address. Accesses external to memory 200 through column decoder 205 and sense amplifiers 204 is preferably made through a P-bit wide data bus 208. For a more detailed description of basic DRAM structure and operation, reference is now made to Sunaga et al. "DRAM Macros For ASIC Chips," *IEEE Journal of Solid State Circuits,* Volume 30, Number 9, September 1995, incorporated herein by reference.

According to the principles of the present invention, each bank 201 further includes a content addressable memory cell (CAM) array 207. As will be discussed further below in conjunction with FIG. 3, each content addressable memory cell array 207 includes a number of CAM cells which are used to compare bank select bits BNKSL presented on bank select bus 210. If the bank select bits BNKSL on bank select bus 210 match the address (comparand) bits stored in a given CAM array 207, the match line 211 of that CAM array 207 enables the corresponding address buffer/latch 206 and row and column address bits presented on address bus 209 are input thereto and latched. A data access to the corresponding cell array 202 can then be made in a conventional manner through corresponding row decoder 203 and column decoder 205.

Bank select bits are written into each CAM array 207 at system initialization by the operating system using CAM wordlines 212, discussed further below. In the preferred embodiment, where only a single bank 201 is accessed at a time, a unique set of address bits are written into each CAM array 207 for unique identification (addressing) of the corresponding memory array 202, although the principles of the present invention are not limited to such embodiments. For example, in alternate embodiments, multiple banks 201 may have the same address bits written into their respective CAM arrays 201. In this case, multiple arrays 202 service data bus 208. In the illustrated embodiment, one CAM select line 212 is provided for each CAM array 207 in memory 200 (a total of X CAM select lines 212).

In the illustrated embodiment, R number of bank select bits BNKSL are received through input/output circuitry 213. During an access (i.e. read or write to the corresponding array 202), the bank select bits BNKSL select the bank 201 to be accessed. During a write to a given CAM array 207, the bank select bits BNKSL on bus 209 represent the comparands to be written into the CAM array 207 corresponding to the active CAM select line 212. The CAM select line 212 to be activated during a CAM array write, is selected in response to select signals CAMSL received through input/output circuitry 213.

The number R, which represents the number of lines in bank select bus 210, the number of received bank select bits BNKSL and the number of CAM select bits CAMSL is a function of the number of banks 201 in the given embodiment of memory 200. In the illustrated embodiment, where 16 banks 201 are used, R is equal to 4, since 4 bits are required to select one bank out of 16 for either a write to corresponding CAM array 207 or a bank select during an array access operation. Similarly, each CAM array includes R number of content addressable memory cells for storing 4 bits for comparison with 4 received bank select bits.

Input/output circuitry 213 also includes conventional data I/O buffers and latches, page mode increment circuitry for generating column addresses for page mode accesses to the cell array 202 of a selected bank 201, clock generation circuitry and power distribution. In the preferred embodiment, addresses are received at address inputs ADD 0–ADD Y from a multiplexed address bus in response to a row address strobe (/RAS) and a column address strobe (/CAS). Data is input and output through data pins DQZ–DQZ in response to an active write enable signal (/We) and data is output through dataput/outputs DQ0–DQZ in response to an output enable signal (/OE).

Figure 3:
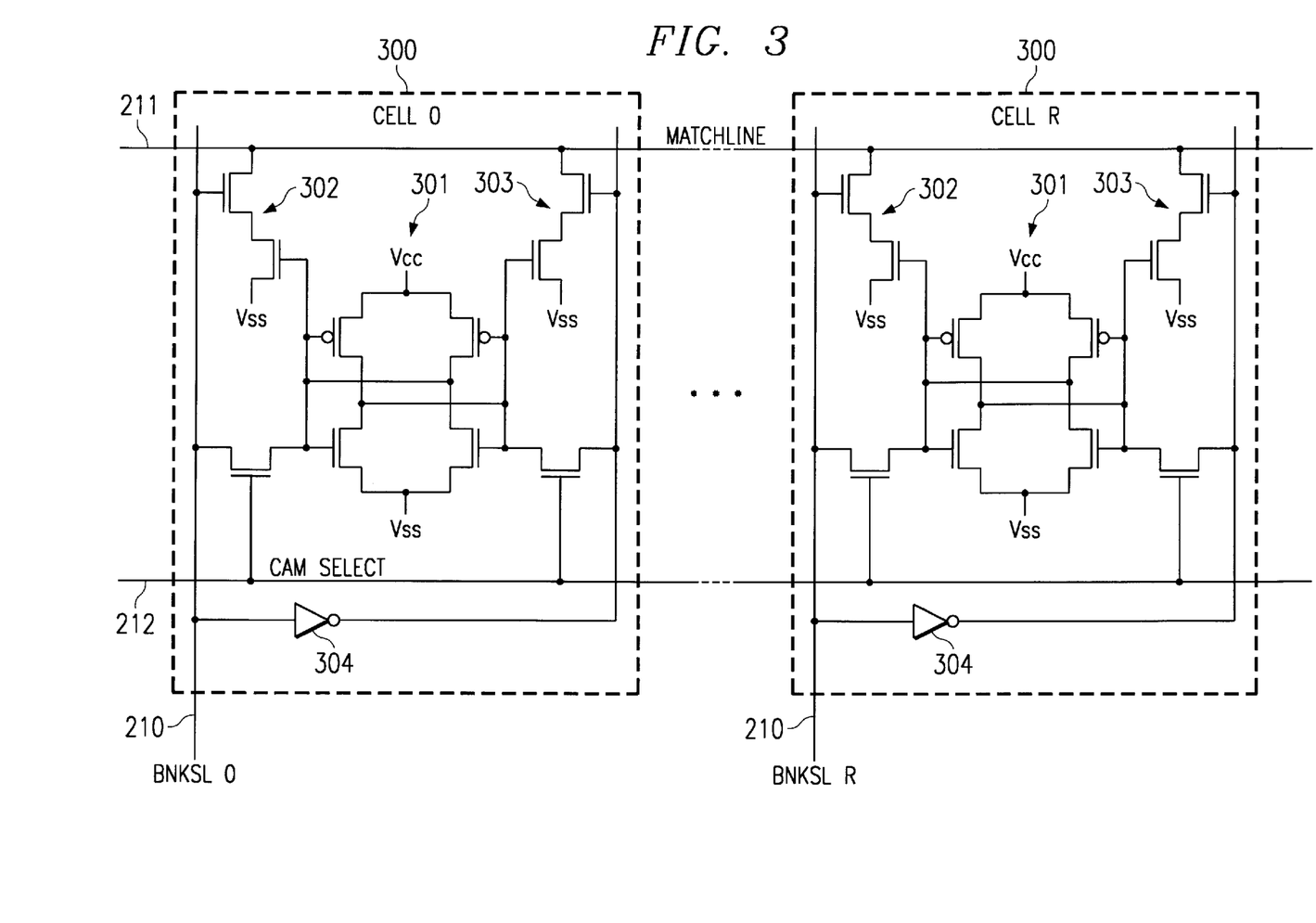
FIG. 3 is an electrical schematic diagram depicting two selected content addressable memory cells of a selected one of the content addressable memory cell arrays shown in FIG. 2.

FIG. 3 is a more detailed functional block of a typical CMOS content addressable memory (CAM) cell 300 array pair. CAM cell 300 is constructed from a six-transistor (6T) SRAM cell, shown generally at 301; and a pair of comparators (XNOR gates), shown generally at 302 and 303. In the preferred embodiment, each CAM array 207 is a linear array of a single row, each row of CAM cells 300 is associated with a CAM select line 212 and a bank enable line 211 to the corresponding address buffer/latch 206. Comparators 306 and 307 are coupled, along with any other CAM cells 300 along the same row to the associated enable line 211 in a wired-OR arrangement. Each column of cells 300 is coupled to a corresponding line of bank select bus 210 and the complement of the data being carried by that line. In the illustrated embodiment, the complementary data is obtained through an invertor 304.

During a write to a given CAM cell 300, the corresponding CAM select line 212 is pulled high and the data to be written is presented on the associated lines of bank select bus 210. The data on each line of address bus 209 are latched by SRAM cell 301 of the corresponding CAM cell 300. During a read, the CAM select line 212 is again pulled high and the data latched in SRAM cell 301 are presented on the corresponding lines of bank select bus 209.

During a compare, the address to be compared is driven onto the corresponding line of bank select bus 210. If a match occurs with the data latched into each SRAM cell 301 in the array, the transistors of comparators 302 and 303 remain turned off and thus do not pull down enable line 211 which continues to float high. If a mismatch in any one cell of the array occurs, the transistors of comparators 302 and 303 turn on and the enable line 211 is pulled to a logic 0. In other words, in the array configuration, for the enable line of a given array 207 to remain at a logic one, the addresses on all the lines of bus 209 must match the data in all the corresponding cells in a CAM array 207.

Figure 4:
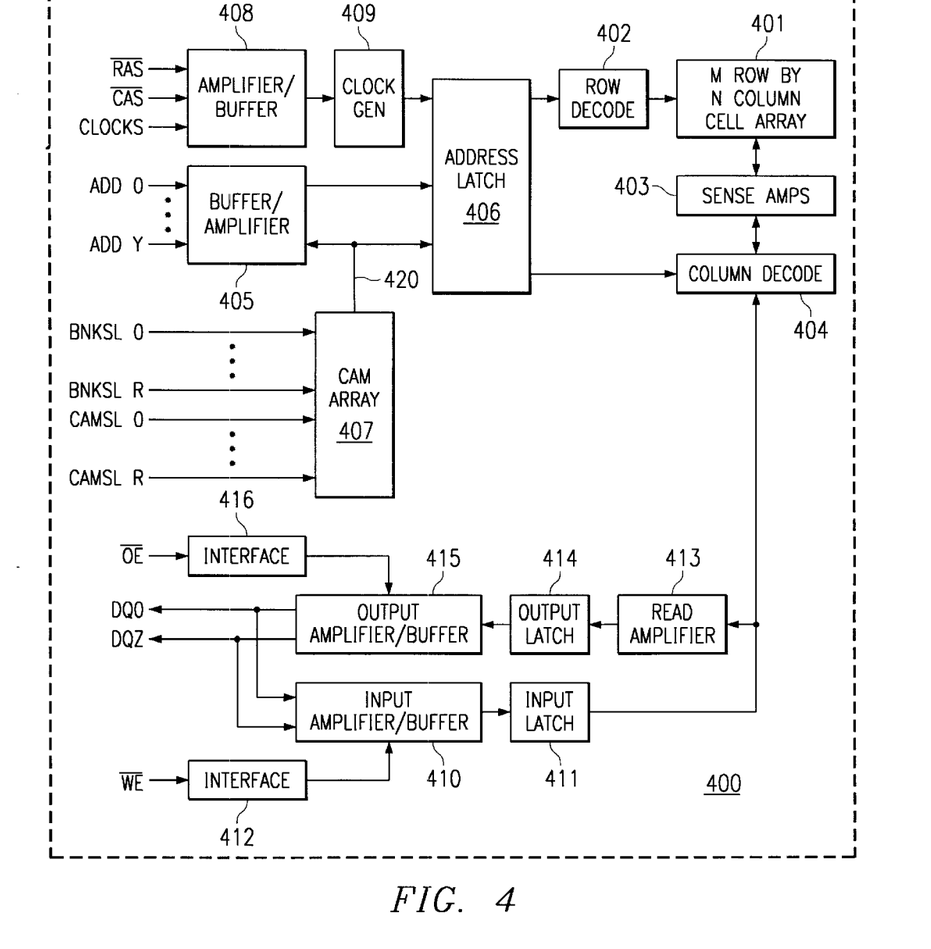
FIG. 4 is a single bank single chip memory device embodying the principles of the present invention.

FIG. 4 depicts a single bank (array) memory device 400 embodying the principles of the present invention. Memory 400 includes an M column by N row memory cell array 401, row decoder circuitry 402, sense amplifiers 403, and column decoders 404. As discussed above in conjunction with the embodiment of FIG. 2, row decoder circuitry 402, sense amplifiers 403, and column decoder circuitry 404 allow for the access of locations within cell array 401 in response to a row and column addresses in a conventional fashion.

In the preferred embodiment of memory device 400 row and column addresses are received from a multiplexed address bus (not shown) in response to /RAS and /CAS signals. These addresses are selectively passed through address buffer/amplifier 405 and an address latch 406, each of which is coupled to the enable line 211 of a CAM cell array 407. Preferably, the structure and function of CAM cell array 407 are similar to those discussed above in conjunction with FIG. 3. In this case, when a match of the address bits written into CAM cell array 407 match the received address (bank select) bits BNKSL0–BNKSLR the match line 420 is placed in an active state which enables buffer/amplifier 405 and address latch 406 to pipeline row and column addresses to row decoder 402 and column decoder 404.

The number of inputs or pins R are provided for receiving CAM array select bits CAMSL0–CAMSLR as well as the number R of inputs or pins provided for receiving bank select bits BNKSL, is selected depending on the potential system applications of memory 400. For example, assume that a system memory is to be constructed from 4 memory devices 400 that each memory device 400 is to be individually selectable. In this case, 4 pins or inputs will be provided for receiving the CAM array select bits for reading and writing address bits into the CAM array 407 and 4 input pins are provided for receiving the bank select bits.

Control signals such as /RAS, /CAS, and clocks, including any master clock if memory 400 is constructed as a synchronous device, are received through an amplifier 408 and are used by a clock generator 409 to generate the clocks necessary to pipeline row and column addresses through address latch 406. Address latch 406 may be for example, a three-phase address latch, as is known in the art.

Memory 400 also includes conventional read and write circuitry for exchanging data with cell array 401 through column decoder 404. The write path includes an input buffer 410 for receiving data from the data pins or inputs DQ0 –DQZ and an input latch 411 for latching data for presentation to column decoder 404. Input amplifier/buffer 410 is enabled by a conventional write enable (/WE) signal received through an interface 412. The read path includes a read amplifier 413, an output latch 414, and an output amplifier/latch buffer 415. Output amplifier/latch buffer 415 is enabled by a conventional output enable signal (/OE) received through an interface 416.

Memory devices, such as memory device 200 and memory device 400, embodying the principles of the present invention can be used in any one of a number of applications where individual bank or device select is required. For example, consider the conventional system memory 105 of system 100 shown in FIG. 1A. In this case, if cache 115 requires reloading, core logic 103 sends a new row address to system memory 105, along with bank select bits BNKSL. Preferably both the row address bits and bank select bits are input with the falling edge of RAS. The bank select bits are presented to all the banks 201, if a multiple bank memory 200 is used, or for all devices 400, if a multiple device memory is used. Once a match of the bank select bits is made by the corresponding CAM array, the row address is input and latched into the associated address latch. Once this occurs, the desired column address is input and latched in response to /CAS. The access to the data required by the cache 115 is then made through core logic 103. In the page mode, additional column addresses generated internal through the selected (active) bank 201 or memory 204.

The principles of the present invention can also be applied to the direct addressing of system memory 105 frame buffer 108 in either the conventional processing system of FIG. 1A or the unified frame buffer system of FIGURE 1B. For example, the bank select bits written into the CAM arrays 207, if a multiple bank device 200 is used, or the CAM arrays 407, if single array devices are used, can be selected to identify banks as being either system memory or frame buffer memory. Then, to access a given memory, CPU 101 and core logic 103 simply generate the appropriate bank select bits BNKSL.

Although the present invention and its advantages have been described in detail, it should be understood that various changes, substitutions and alterations can be made herein without departing from the spirit and scope of the invention as defined by the appended claims.

What is claimed is:

1. A memory comprising:

an array of addressable memory cells;

addressing circuitry for accessing selected ones of said memory cells in response to received location address bits said address circuitry including a row decoder for selecting a row of said memory cells of said array in response to a row address and a column decoder for accessing selected cells along a said selected row in response to a column address;

an address buffer for selectively passing said received address bits to said addressing circuitry; and a content addressable memory cell including latching circuitry for storing a select bit associated with the array and an exclusive-NOR gate for comparing a received select bit with the stored select bit associated with said array, said exclusive-NOR gate having an output coupled to an enable line coupled to said address buffer for selectively enabling presentation of said address bits through said address buffer to said addressing circuitry for accessing addressed ones of said memory cells, said content addressable memory cell having a first input for receiving a signal to enable writing said stored select bit into said latching circuitry, and having one or more content inputs for receiving a bit to be stored.

2. The memory of claim 1 wherein said content addressable memory cell enables access to said addressed ones of said memory cells when said received select bit matches said stored select bit.

3. The memory of claim 1 wherein said array of memory cells comprises an array of dynamic random access memory cells.

4. The memory of claim 1 wherein said array of memory cells comprises an array of static random access memory cells.

5. The memory of claim 1 wherein said addressing circuitry comprises:

a row decoder for selecting a row of said memory cells of said array in response to a row address; and a column decoder for accessing selected cells along a said selected row in response to a column address.

6. The memory of claim 1 wherein said content addressable memory cell comprises:

a latch for storing said stored select bit; and a logic gate for comparing said stored select bit with said received bit.

7. A memory subsystem comprising:

first and second arrays or memory cells;

first addressing circuitry for selectively accessing ones of said cells in said first array, said first addressing circuitry including a row decoder for selecting a row in said first array in response to a row address and a column decoder for accessing selected cells along said selected row;

a first address latch for presenting a latched address to said first array;

second addressing circuitry for selectively accessing ones of said cells in said second array, said first addressing circuitry including a row decoder for selecting a row in said first array in response to a row address and a column decoder for accessing selected cells along said selected row;

a second address latch for presenting a latched address to said second array;

at least one first content addressable memory cell including a latching circuit for storing a first bank select bit associated with said first array of memory cells, an exclusive-NOR gate for comparing said stored first bank select bit with a received bank select bit and an enabling line for coupling an enable signal from said exclusive-NOR gate to said first address latch for enabling the latching of said first address into said first address latch to present said first address latch to said first addressing circuitry upon a match; and at least one second content addressable memory cell including a latching circuit for storing a second bank select bit associated with said second array of memory cells, an exclusive-NOR gate for comparing said stored second bank select bit with a received bank select bit and an enabling line for coupling an enable signal from said exclusive-NOR gate to said second address latch enabling the latching of said second address into second address latch to present said second address to said second addressing circuitry upon a match.

8. The memory subsystem of claim 7 wherein said memory subsystem is fabricated on a single chip.

9. The memory system of claim 7 wherein said first addressing circuitry comprises:

a row decoder for selecting a row in said first array in response to a row address; and a column decoder for accessing selected cells along a said selected row.

10. The memory subsystem of claim 7 wherein said second addressing circuitry comprises:

a row decoder for selecting a row in said second array in response to a row address; and a column decoder for accessing selected cells along a said selected row.

11. The memory subsystem of claim 7 wherein said at least first one content addressable memory cell comprises:

a latching circuit for storing a said first bank select bit;

at least one exclusive-NOR gate for comparing said first bank select bit with a received bank select bit; and an enable line coupled to said exclusive-NOR gate for outputting said enable signal to said first addressing circuitry.

12. The memory of claim 7 wherein said at least one second content addressable memory cell comprises:

a latching circuit for storing a said second bank select bit;

at least one exclusive-NOR gate for comparing said second bank select bit with a received bank select bit; and an enable line coupled to said exclusive-NOR gate for outputting said enable signal said to second addressing circuitry.

13. A memory device comprising:

an address bus;

a bank select bus; and a plurality of memory banks each comprising:
   an array of rows and columns of memory cells;
   row and column decoders for accessing selected cells within said array in response to received row and column addresses;
   circuitry for coupling addresses presented on said address bus to said decoders in response to an enable signal; and
   an array of content addressable memory cells, each said content addressable memory cell including a latching circuit for storing a bank select bit, an exclusively-OR gate for comparing said stored bank select bit with a bank select bit presented on said bank select bus and an enable line coupled to said exclusive-NOR gate for outputting an enable signal when a match occurs.

14. The memory device of claim 13 and further comprising a plurality of content addressable memory select lines, a said select line for presenting a signal to an associated one of said arrays of content addressable memory arrays for writing thereto bank select bits presented on said bank select bus.

15. The memory device of claim 13 wherein each said content addressable memory cell comprises:
   a latching circuit for storing a said bank select bit;
   a logic gate for comparing said stored bank select bit with a received bank select bit; and
   an enable line coupled to said logic circuit gate for outputting a said enable signal.

16. The memory device of claim 15 wherein said latching circuitry comprises an SRAM cell.

17. The memory device of claim 15 wherein said logic gate comprises an exclusive-OR gate.

18. A method of addressing a memory system including a bank of memory cells and associated addressing circuitry, access to selected cells in the bank controlled by row and column addresses presented to the addressing circuitry, the bank associated with at least one content addressable memory cell including a latching circuit for storing a bank select bit identifying the bank, at least one exclusive-NOR gate for comparing the stored bank select bit with a received bank select bit, and an enable line coupled to the exclusive-NOR gate for outputting an enable signal to the addressing circuitry, the method comprising the steps of:
   enabling said content addressable memory to store the bank select bit identifying the bank;
   storing said bank select bit identifying the bank in the latching circuitry of content addressable memory cell;
   receiving a row address to a selected row in the array and a bank select bit for presentation to the content address addressable memory cell in response to a row address strobe; and
   receiving a column address to access selected cells in the selected row in response to a column address strobe;
   presenting a bank select bit to the content addressable memory cell
   comparing in the content addressable memory cell the stored bit with the presented bit; and
   passing address bits through an address buffer in response to an enable signal from said content addressable memory cell to the addressing circuitry to access selected cells in the array when the stored bit and the present bit match.

19. The method of claim 18 wherein access to selected cells in the bank is controlled by row and column addresses presented to the addressing circuitry and the method further comprises the steps of:
   receiving a row address to a selected row in the array and a bit for presentation to the content address addressable memory cell in response to a row address strobe; and
   receiving a column address to access selected cells in the selected row in response to a column address strobe.

20. The method of claim 18 wherein said bank comprises one of a plurality of banks disposed on a single chip and said step of presenting comprises the step of presenting a bank select bit to the plurality of banks.

21. The method of claim 18 wherein said bank comprises one of a plurality of banks disposed on discrete devices and said step of presenting comprises the step of presenting a bank select bit to each of the discrete devices.

22. The method of claim 18 wherein the addressing circuitry includes an address latch and said step of enabling comprises the step of enabling input of an address to the selected cells into the address latch.

23. The method of claim 18 wherein the addressing circuitry includes an address buffer and said step of enabling comprises the step of enabling the address buffer.

* * * * *